United States Patent [19]
Yazu et al.

[11] Patent Number: 5,124,884
[45] Date of Patent: Jun. 23, 1992

[54] ELECTRONIC PART MOUNTING BOARD AND METHOD OF MANUFACTURING THE SAME

[75] Inventors: Hajime Yazu; Takao Iriyama, both of Gifu, Japan

[73] Assignee: Ibiden Co., Ltd., Ogaki, Japan

[21] Appl. No.: 611,084

[22] Filed: Nov. 9, 1990

[30] Foreign Application Priority Data

Nov. 9, 1989 [JP] Japan .................. 1-291756

[51] Int. Cl.$^5$ .............................. H05K 7/20
[52] U.S. Cl. ................... 361/387; 361/386; 361/388; 165/185; 357/81; 174/16.3
[58] Field of Search .............. 361/386, 387, 388, 389, 361/401, 412, 414; 428/209; 174/16.3; 165/185; 357/81

[56] References Cited

U.S. PATENT DOCUMENTS

| | | | |
|---|---|---|---|
| 4,322,778 | 3/1982 | Barbour et al. | 361/414 |
| 4,561,011 | 12/1985 | Kohara et al. | 356/81 |
| 4,737,395 | 4/1988 | Mabuchi et al. | 428/138 |
| 4,739,448 | 4/1988 | Rowe et al. | 361/386 |
| 4,773,955 | 9/1988 | Mabuchi et al. | 156/257 |
| 4,835,598 | 5/1989 | Higuchi et al. | 357/72 |

FOREIGN PATENT DOCUMENTS

0197148 10/1986 European Pat. Off. .
59-32191 2/1984 Japan .

*Primary Examiner*—Leo P. Picard
*Assistant Examiner*—Young S. Whang
*Attorney, Agent, or Firm*—Oblon, Spivak, McClelland, Maier & Neustadt

[57] ABSTRACT

An electronic component mounting board includes a substrate having an electronic component mounting opening formed in an upper surface thereof and a recess provided on a rear surface thereof larger in size than the electronic component mounting opening; a heat radiating plate fixed to the recess by bonding material with a position of an upper surface of that heat radiating plate exposed to the electronic component mounting opening; an exposed depression extending over the substrate and the heat radiating plate at a position where a side wall of the recess and a side wall of the heat radiating plate confront each other and having a part of the bonding material exposed flush with a bottom surface thereof; and a metal plating layer continuously covering in sequence a lower surface of the heat radiating plate, a surface of the exposed depression and a rear surface of the substrate. A method of manufacturing the aforesaid electronic component mounting board is also set forth.

24 Claims, 10 Drawing Sheets

ELECTRONIC PART MOUNTING BOARD AND METHOD OF MANUFACTURING THE SAME

BACKGROUND OF THE INVENTION

1. FIELD OF THE INVENTION

The present invention relates to a moisture-proof electronic component mounting board and to a method of manufacturing the same.

2. DESCRIPTION OF THE PRIOR ART

The conventional electronic component mounting board has openings formed in the upper surface using an end mill thereof on which electronic parts are mounted and a heat radiating plate on the opposite surface thereof so that the heat from the electronic parts such as semiconductors may be radiated (for example, reference is made to Japanese Laid-Open Patent No. 32191-1984, and U.S. Pat Nos. 4,773,955 and 4,737,395).

Further, it has been usual that the above-mentioned heat radiating plate is bonded to a recess of the board with a bond. Although the electronic parts mounted on the board have their surfaces protected with a moisture-resistant sealing resin, yet moisture penetrates into the electronic parts through the bond. Therefore, it has also been practiced to cover with a metal plating layer the area exposed to the atmosphere, namely, the area between the side wall of the recess and the side wall of the heat radiating plate. The structure of such a board will be described with reference to FIGS. 19A through 21.

According to a conventional method of manufacturing an electronic part mounting board, a recess 92 (FIG. 19A) to which a heat radiating plate is bonded is first formed on a substrate 9 in the form of a copper-coated laminated plate as shown in FIGS. 19A through 19E. Next, the heat radiating plate 7 is, bonded to the surface 921 of the recess 92 with a bonding material 8 (FIG. 19B). Reference number 91 designates a metal layer formed of copper foil or the like.

Next, as shown in FIG. 19C, the upper surface of the substrate 9 is counter sunk until the heat radiating plate 7 is exposed to thereby form a mounting opening 93 for electronic parts. Then, as shown in FIG. 19D, a metal plating layer 76 is formed on the inner wall of the mounting opening 93 and on the exposed upper surface of the heat radiating plate, and another metal plating layer 75 is formed to cover the lower surface of the heat radiating plate 7 and the rear surface of the substrate 9.

After that, a pattern 94 is formed as shown in FIG. 19E to thereby provide an electronic component mounting board 90.

The board 90 thus obtained has the metal plating layer 75 covering the lower surface of the heat radiating plate 7 and the rear surface of the substrate 9 and the metal plating layer 76 covering the exposed part of the upper surface of the radiating plate 7 and the inner wall of the mounting opening 93 as shown in FIG. 19E. Therefore, penetration of moisture from the rear surface of the substrate 9 into the mounting opening 93 is hindered.

However, the above-mentioned electronic part mounting board 90 has sometimes had the defect that, as shown In FIG. 20, the portion (clearance) 95 between the side wall of the recess 92 and the opposing side wall of the heat radiating plate fails to be covered by the metal plating 75 with the formation of an opening 750 in that layer 75. That is, a hole 751 is formed due to an insufficient metal plating.

When such a defective hole 751 is formed, there is a danger that an electronic part such as a semiconductor is damaged due to penetration of moisture therefrom. Especially, when the substrate 0 is made of a resin type material, moisture penetrates into the recess 92 from the defective hole 751 and reaches the electronic part (not shown) via the resin material.

It is felt that the formation of the above-mentioned defective hole 751 depends on the size of the clearance 95 between the recess 92 and the heat radiating plate 7. That is, the larger the clearance 95 (e.g., about 0.1–0.2 mm), the larger the opening 750 resulting in discontinuity of the metal plating layer 75 thereat.

Therefore, it may be contemplated to reduce the size of the clearance 95. However, the clearance tends to be formed notwithstanding because of scatterings in the processing of recess 92 and the shaping of the heat radiating plate 7.

Further, as a countermeasure against the above-mentioned problems, there is considered a method in which, as shown in FIG. 21 recess 92 is made wider to enlarge the clearance between the side wall of the recess 92 and that of the heat radiating plate 7 at the reversed bottom surface 921 of the recess and then the metal plating layer 75 is continuously formed over the lower and side surfaces of the heat radiating plate, the side surfaces and reversed bottom surface 921 of the recess 92, and the rear surface of the substrate 9. Thus, according to this method, the metal plating layer 75 is formed to cover the above-mentioned clearance too, because the clearance 95 is sufficiently large.

However, the above method is disadvantageous in that the enlarged recess 92 hinders the freedom of formation of a pattern on the rear surface of the substrate 9. On the other hand, if the size of the recess 92 is limited, the heat radiating plate 7 will inevitably become small-sized resulting in hindering the heat radiating property thereof.

Moreover, in the above method, the bonding material 8 may sometimes overflow from between the bottom surface 921 of the recess 92 and the heat radiating plate 7 at the time of bonding. Thus, if the bond overflows too much, the metal plating layer 75 will not be sufficiently formed. Therefore, it becomes necessary to adjust the amount of bonding material 8 used.

SUMMARY OF THE INVENTION

The present invention has been made in view of the above-mentioned problems and an object of the invention is to provide a heat radiating and moistureproof electronic component mounting board and a method of manufacturing the same wherein a metal plating layer is satisfactorily formed over a substrate and a heat radiating plate at a position where the side wall of a recess and that of a heat radiating plate confront each other and it is unnecessary to adjust the amount of the bonding material.

The present invention provides an electronic component mounting board of the type comprising a substrate having an opening for mounting an electronic component and a recess provided on a rear surface of the substrate and larger than the electronic component mounting opening; a heat radiating plate fixed to the recess by means of a bonding material with its rear surface exposed to the mounting opening; an exposed depression extending over the substrate and the heat radiating plate at a position where the side wall of the recess and the sidewall of the heat radiating plate confront each other and having a part of the bonding material exposed flush with a bottom surface thereof; and a metal plating layer continuously covering in sequence the lower surface of the heat radiating plate, the surface of the exposed depression and a rear surface of the substrate.

The most important feature of the present invention is that the exposed depression is formed at the position where the side wall of the recess and the side wall of the heat radiating plate confront each other and the heat radiating plate, the exposed depression and the substrate are continuously covered with the metal plating layer.

The exposed depression is so formed as to extend over both the substrate and the heat radiating plate. Further, the recess is square or circular in shape and usually formed at the center of the substrate and the heat radiating plate is similar in shape to the recess. As a result, the clearance between the two is usually square or circular in shape (FIG. 3).

Further, the bonding material is filled into the clearance, i.e., the space between the side wall of the recess and the side wall of the heat radiating plate and is exposed at the exposed depression. The exposed surface of bonding material substantially flush with the reversed bottom surface of the exposed depression.

The substrate may be made of glass-epoxy resin, glass-bismaleimide-triazine resin, glass-polyimide resin, and so forth. Further, the heat radiating plate may be made of copper, ferroalloys, copper alloys, and so forth.

The bonding material may be a fluidizable adhesive sheet known as "PREPREG". The bond may consists of epoxy resin, bismaleimide-triazine resin (BT resin), polyimide resin, and so forth. The metal plating layer may consists of copper, nickel, gold, and so forth.

It is preferable that the length of the clearance or distance between the substrate and the heat radiating plate be on the order of 0.05 mm–0.3 mm. If it is less than 0.05 mm, strict dimensional accuracy will be required of the heat radiating plate and the recess while, if exceeding 0.3 mm, the width of the bonding material layer will be too large for the metal plating layer to be sufficiently formed. The depth of the exposed depression should preferably on the order of 0.05 mm–0.2 mm because if it is less than 0.05 mm, the precision requirements for the thickness of the substrate and the machining of the recess will become more strict while, if exceeding 0.2 mm, the metal machining load will increase.

Further, it is preferable that the width of the exposed depression be on the order of 0.5 mm–2.0 mm. If less than 0.5 mm, the blade of the cutting tool, which must be small will easily fracture while if exceeding 2.0 mm, the machined depression will have a dead space so that the effective wiring area of the board will be restricted.

Next, as one example of the method of manufacturing the above-mentioned electronic component board according to the present invention, the following method is presented, which comprises the steps of: forming a recess in the rear surface of the substrate; bonding a heat radiating plate to the recess by using a bonding material in such a manner that the bonding material is filled almost up to the open side of the clearance between the side walls of the recess and the heat radiating plate; countersinking the portions of the substrate and the heat radiating plate adjacent the open side of the above-mentioned clearance to thereby provide an exposed depression at which the bonding material is exposed; forming an electronic part mounting opening through the substrate and the bonding material from the upper surface of the substrate to reach the upper surface of the heat radiating plate and covering continuously the lower surface of the heat radiating plate, the inner surface of the exposed depression and the rear surface of the substrate with a metal plating layer.

The most important feature of the above manufacturing method resides in that when the heat radiating plate is bonded to the recess, the bonding material fills the clearance between the substrate and the heat radiating plate almost up to the open side of the clearance, then the portions of the substrate and the heat radiating plate adjacent to the open side of the clearance are countersunk to thereby provide the exposed depression and finally, the rear surface of the substrate, the lower surface of the heat radiating plate and the inner surface of the depression (at which the bonding material is exposed) are continuously covered with the metal plating layer.

It is preferable that the bonding material somewhat projects beyond the open side of the clearance because by so doing, it becomes possibly to make sure the clearance is completely filled with the bonding material up to the open side thereof. Such projection or bulge of the bonding material is removed when the exposed depression is formed by countersinking the heat radiating plate and the substrate.

The exposed depression may be in various shapes such as being square (FIG. 2C), semicircular (FIG. 4), triangular (FIG. 5) and elliptical (FIG. 6). These shapes enable the exposed portion of the bonding material to be easily plated with a metal.

It should be noted that, as will be understood from the embodiments of the present invention that follow, the inner surface of the electronic component mounting hole is in some cases covered with the metal plating layer and in other cases, is not.

BRIEF DESCRIPTION OF THE DRAWINGS

FIGS. 1 through 3 illustrate an electronic component mounting board according to a first embodiment of the present invention of which FIG. 1 is a sectional view of the board, FIGS. 2A through 2E illustrate how the printed board of FIG. 1 is manufactured and FIG. 3 is a rear view of the structure of FIG. 2E;

FIGS. 19A through 19E and FIG. 20 are illustrations of conventional electronic component mounting boards, of which, FIGS. 19A through 19E are views illustrating how the electronic component mounting board is manufactured and FIG. 20 is a sectional view of the same.

DETAILED DESCRIPTION OF THE PREFERRED EMBODIMENTS

Figure 20:
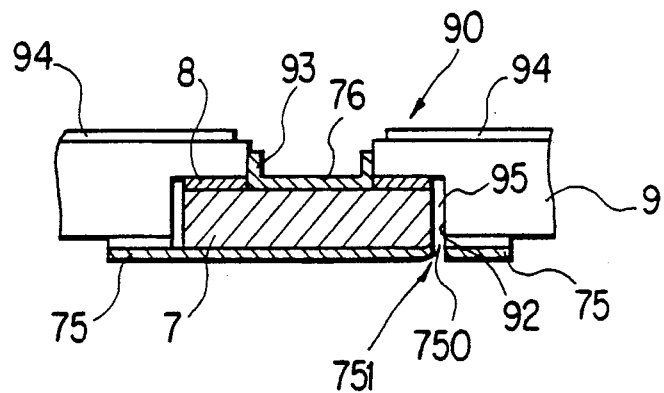

The present invention has the following various advantages over the prior art:

The electronic component mounting board according to the present invention is provided with the exposed depression extending over the substrate and the heat radiating plate and the bonding material is exposed at the depression so that when the rear surface of the substrate is covered with the metal plating layer, the layer covers the surface of the depression. If the bonding material is not present in the clearance between the opposing side walls of the heat radiating plate and the substrate (see FIG. 20) as in the case of the prior art methods or the bond remains projecting outside, the metal plating layer would not be formed completely continuous.

Further, in the present invention, the exposed depression is formed by filling the above-mentioned clearance with a bonding material and then countersinking the substrate and the heat radiating plate adjacent to the open side of the clearance. That is, as the reversed bottom surface of the exposed depression is flush with the lower surface of the heat radiating plate, the exposed portion of the bonding material and the rear surface of the substrate in that order so that the metal plating layer is formed over these parts without interruption. In this case, a sufficient amount of bonding material is used for filling the clearance and the bonding material may project outside depending on circumstances. Therefore, it is not necessary to suitably adjust the filling amount of the bond lest the bond should project outside as in the case of the prior art method.

Figure 21:
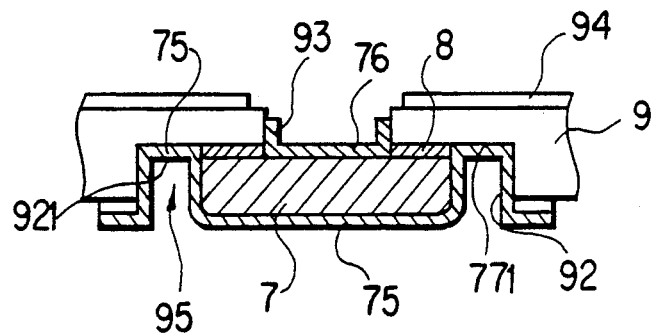
FIG. 21 is a sectional view of another conventional electronic component mounting board.

Unlike the conventional technique shown in FIG. 21, it is not necessary with the present invention to enlarge the space of the clearance between the substrate and the heat radiating plate. Therefore, the heat radiating plate can be made as large as the pattern formation permits, thereby improving the heat radiating property of the plate.

In addition, as the metal plating layer continuously covers the lower surface of the heat radiating plate, the exposed depression and the rear surface of the substrate, there is no possibility of penetration of moisture into the electronic part from rear side of the substrate.

In conclusion, it is possible with the present invention to provide an electronic component mounting board which has excellent heat radiating and moistureproof properties an in which the metal plating layer is securely formed at the open side of the clearance between the substrate and the heat radiating plate and the necessity of adjusting the amount of bonding material used can be eliminated.

1.
First Embodiment

An electronic component mounting board as a first embodiment of the present invention will be described with reference to FIGS. 1 through 3.

Figure 1:
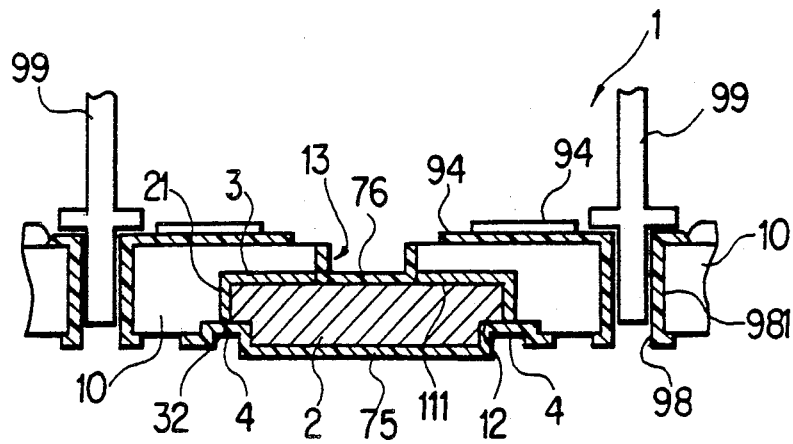

As shown in FIG. 1, the electronic component mounting board 1 comprises a substrate 10 provided with at least an opening 13 formed in the upper surface thereof for mounting an electronic part and, a recess 11 which is larger in size than the opening 13 and formed on the rear surface thereof (see FIG. 2A), and a heat radiating plate 2 fixed to the recess 11 by means of bonding material 3 with its upper surface exposed to the opening 13. At a portion of the rear surface of the substrate 10 where a side wall 12 of the recess 11 and a side wall 21 of the heat radiating plate 2 confront each other, there is formed an exposed depression 4 having a width extending between both the heat radiating plate 2 and the substrate 10. Moreover, at the reversed bottom surface area of the exposed depression 4, a portion of the radiating plate 2, an exposed portion of the bonding material 3 and a portion of the substrate 10 are flush with one another. In addition, the lower surface of the heat radiating plate 2, the exposed depression 4 and the rear surface of the substrate 10 are continuously covered with a metal plating layer 75.

Further, the inner surface of the opening 13 is covered with a metal plating layer 76 and a pattern 94 is formed on the upper surface of the substrate 10. In addition, the substrate 10 is provided with through-holes 98 which are internally covered with metal plating layers 981 and into which conductive pins are respectively inserted.

Figure 2A:
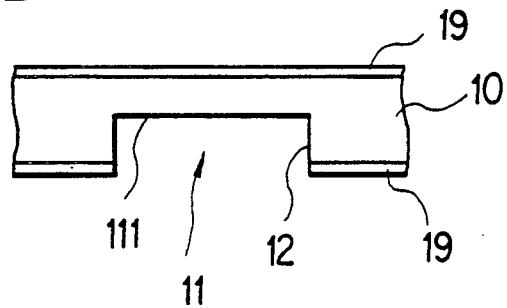

Next, a method of manufacturing the electronic component mounting board 1 will be described by referring to FIGS. 2A through 2E, First, as shown in FIG. 2A, the recess 11 for attachment of the heat radiating plate 2 thereto is formed on the rear surface of the substrate 10 by spot facing using an end mill. The recess 11 has a side wall 12 and a ceiling surface 111. Additionally, the substrate 10 has a laminated structure lined with copper foils 19 on both surfaces thereof, respectively.

Figure 2B:
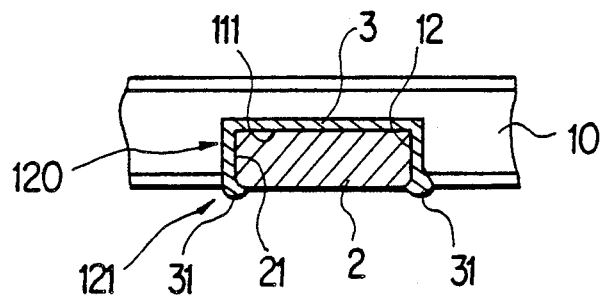

Next, as shown in FIG. 2B, the heat radiating plate 2 is bonded to the recess portion 11 by means of the bonding material 3. In this case, the bonding material 3 fills the clearance between the ceiling 111 of the recess 11 and the upper surface of the heat radiating plate 2 and the clearance 120 between the side wall 12 of the recess 11 and the opposing side wall 21 of the plate 2. The bonding material 3 overflows to the outside area from the opening side 121 of the clearance 120, thereby forming a bulging part 31. Therefore, the entire space between the heat radiating plate 2 and the recess 11 is completely filled with the bonding material 3.

Figure 2C:
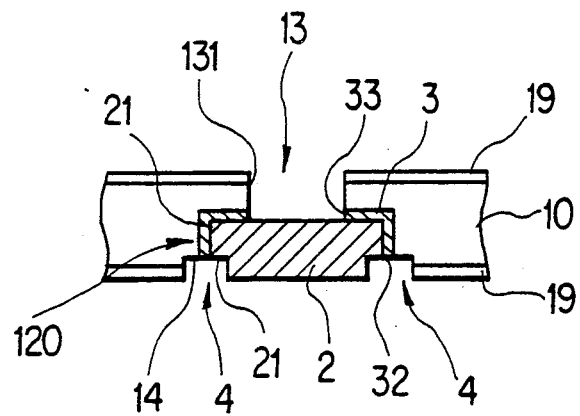

Further, as shown in FIG. 2C, the exposed depression 4 extending over both the substrate 10 and the heat radiating plate 2 is formed by countersinking using an end mill at the open side 121 of the clearance 120 between the side wall 12 of the recess 11 and the opposing side wall of the heat radiating plate 2. As a result, the reversed bottom surface of the exposed depression 4 includes a stepped portion 14 of the substrate 10, a stepped portion 21 of the heat radiating plate 2 and an exposed portion 32 of the bonding material 3 all of which are in the same plane.

As regards the upper surface of the substrate 10, there is formed the electronic part mounting opening 13 by countersinking using an end mill so that the upper surface of the heat radiating plate 2 is exposed to the opening 13. The side wall 131 of the opening 13 and the exposed portion 33 of the bond 3 are in the same plane flush with each other and the opening 13 is smaller in size than the recess 11.

Figure 2D:
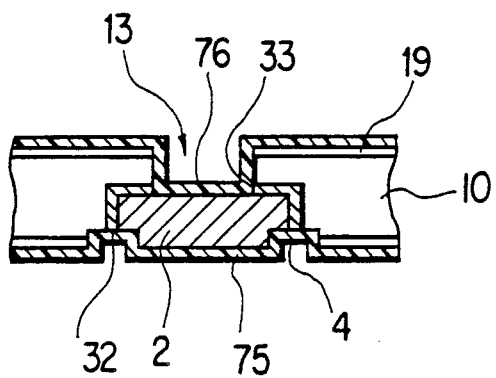

Next, as shown in FIG. 2D, a metal plating layer 75 continuously covering the lower surface of the heat radiating plate 2, the exposed depression 4, and the rear surface of the substrate 10. Also on the upper surface of the substrate 10 with the inclusion of the opening 13, there is formed a metal plating layer 76. These metal plating layers 75 and 76, and the aforesaid metal plating layers 981 for the through-holes 98 are formed simultaneously.

Figure 2E:
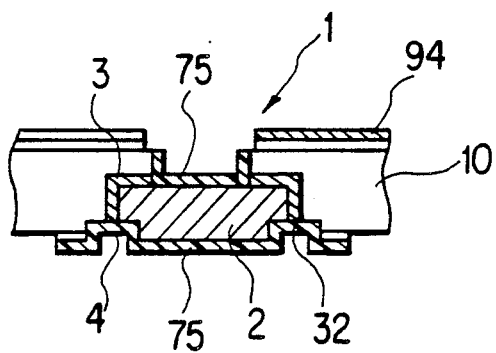

After that, the pattern 94 is formed by etching, and the metal plating layer 75 formed on the rear surface of the substrate 10 is partially removed by etching as shown in FIG. 2E. Thus by the steps described so far, the electronic part mounting board is obtained. The product is identical with the board shown in FIG. 1.

Figure 3:
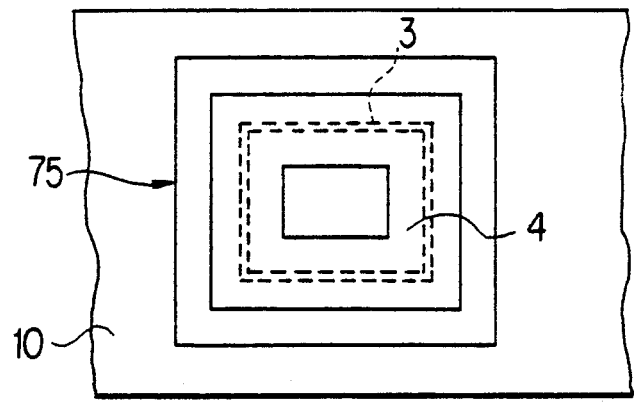

On the rear surface of the substrate, the metal plating layer 75 is continuously formed as shown in FIGS. 2E and 3.

As described above, the electronic component mounting board 1 has the exposed depression 4 extending over the substrate 1 and the heat radiating plate 2 at the portion where the side wall of the recess 11 and the sidewall of the heat radiating plate 2 confront each other, and the metal plating layer 75 continuously covers the rear surface of the substrate 10, the exposed depression 4 and the lower surface of the heat radiating plate 2. Moreover, as shown in FIG. 2C, the stepped portion 14 of the substrate, the exposed portion 32 of the bond, and the stepped portion 21 of the heat radiating plate 2 are flush with each other. Owing to this arrangement, the metal plating layer 75 is unfailingly formed on the surfaces of these elements in a continuous fashion.

Moreover, in the instant embodiment, a bulge 31 is formed as a result of overflowing of the bonding material 3 as shown in FIG. 2B when the heat radiating plate 2 is bonded. Therefore, the bonding material 3 completely fills the clearance or distance between the heat radiating plate 2 and the recess 11. Then, the bulge 31 is removed when the exposed depression 4 is formed by countersinking as shown in FIG. 2C.

Accordingly, the bond 3 is exposed flush with the reversed bottom surface of the exposed depression 4 and the metal plating layer 75 is therefore formed without interruption. Consequently, it is not necessary to adjust the amount of the bonding material so as to satisfactorily fill the clearance with the bonding material without overflowing.

Further, unlike the conventional method illustrated in FIG. 21, it is not necessary to provide a large space between the side wall of the recess 11 of the substrate 10 and the side wall of heat radiating plate 2. Consequently, the heat radiating plate can be made as large a possible within the recess 11, thereby improving the heat radiating property thereof. In addition, as the metal plating layer 75 is continuously formed over the heat radiating plate, the exposed depression and the rear surface of the substrate, there is no possibility of penetration of moisture into the electronic part mounted on the board.

2. Second Embodiment

Figure 4:
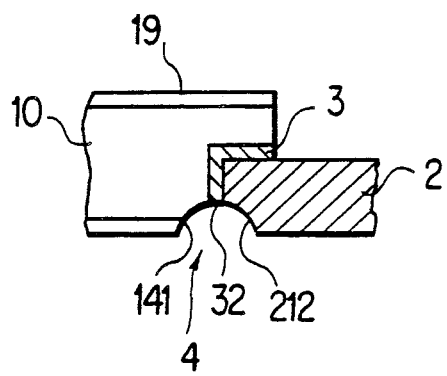
FIGS. 4 through 6 are views showing various shapes of an exposed depression according to a second embodiment of the present invention.
Figure 5:
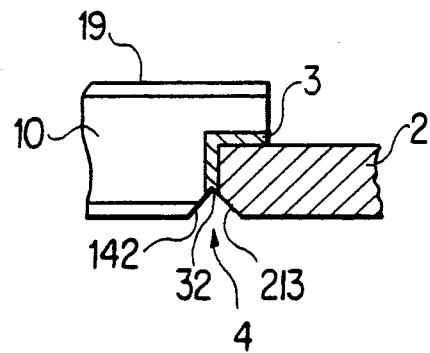
Figure 6:
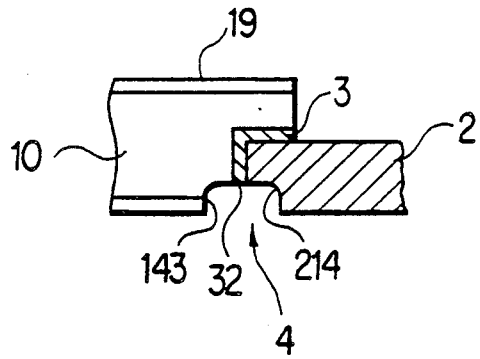

As shown in FIG. 4 through FIG. 6, this embodiment is a modification of the first embodiment, wherein the exposed depression 4 is shown in a variety of shapes.

Specifically, the exposed depression 4 shown in FIG. 4 is semicircular in section and includes an arc-shaped surface 141 forming part of the substrate 10, the exposed end 32 of the bonding material 3 and an arc-shaped surface 212 forming part of the heat radiating plate 2.

Likewise, the exposed depression 4 shown in FIG. 5 is triangular in section and includes a slanted surface 142 forming part of the substrate 10, the exposed end 32 of the bonding material and a slanted surface 213 forming part of the heat radiating plate 2.

Moreover, the exposed depression 4 shown in FIG. 6 is approximately elliptical in section and includes an arc-shaped part 143 forming a part of the substrate 10, the exposed end 32 of the bonding material 3 and an arc-shaped part 214 forming a part of the heat radiating plate 2.

In any of the above-mentioned shapes of the exposed depression 4, the parts forming the exposed depression 4 are continuous with one another so that the metal plating layer can be formed continuously over these parts without fail with the same advantageous effects as in the first embodiment.

3. Third Embodiment

Now, a concrete example based on the first embodiment will be described as a third embodiment.

In this embodiment, a copper-coated laminated board made of bismaleimide-triazine resin (BT resin) material having a thickness of 1.6 mm was used as the substrate 10.

The concave portion 11 for bonding the heat radiating plate was square in shape measuring 1.2 mm in depth and 20 mm each in length and width. A square copper plate was used as the radiating plate 2 which measured 1.2 mm in thickness and 19.8 mm each in length and in width, with the result that the clearance 120 between the recess 11 and the heat radiating plate 2 was about 0.1 mm.

A PREPREG adhesive agent made of BT resin was used as the bonding material 3. The heat radiating plate was thermally bonded with the bonding material 3 at 170° C. The height of the bulge 31 of bonding material 3 was about 0.1 mm and the depth of the exposed depression 4 (FIG. 2C) was 0.1 mm and its width was 1.0 mm. The exposed depression 4 in this case represented a square annular form extending along the clearance 120.

The metal plating layers 75 and 76 were formed either by a non-electrolytic process or electrolytic process and the thickness of each of the layers was approximately 20 μm. Further, the metal plating layer 75 is formed over the heat radiating plate 2, the exposed depression 4 and the rear surface of the substrate. The metal plating layer 76 was continuously formed in a like manner.

For comparison purposes, the metal plating layer 75 was formed until the bulge 31 of the bonding material 3 appeared, as shown in FIG. 2B and the result was that there were observed many portions which the metal plating layer failed to cover at the bulge 31 of the bonding material 3.

4. Fourth Embodiment

Figure 7:
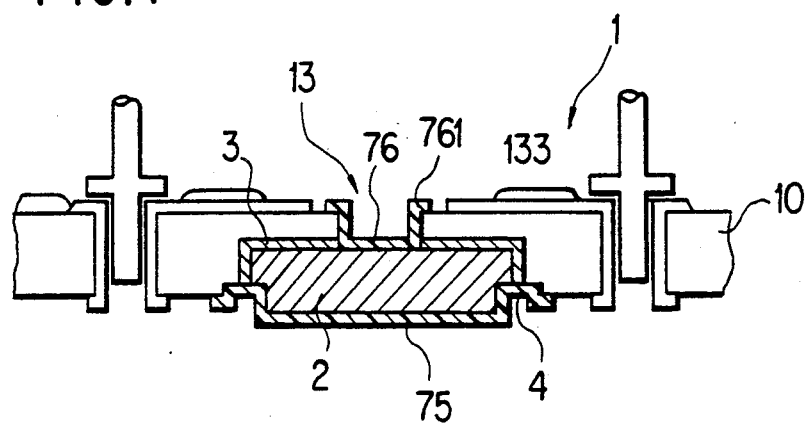
FIGS. 7 and 8 are sectional views, respectively, of an electronic part mounting board according to a fourth embodiment of the present invention.
Figure 8:
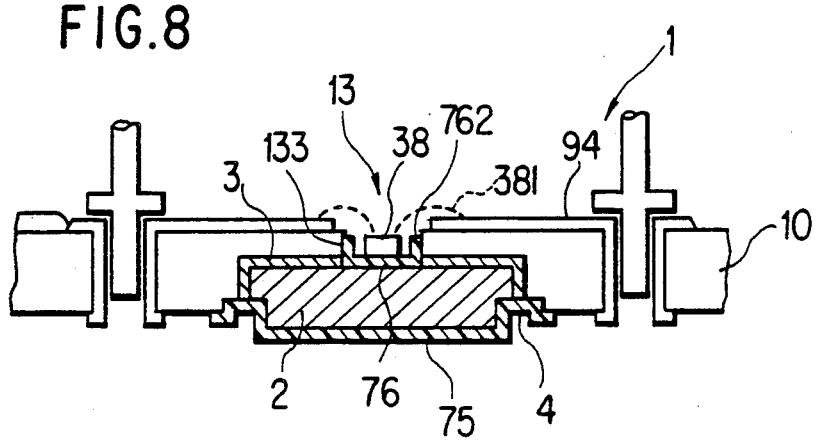

This embodiment represents a case in which the covering range of the metal plating layer 76 within the mounting opening 13 is changed as shown in FIGS. 7 and 8, with respect to the first embodiment.

That is, in FIG. 7, the metal plating layer 76 covers the opening 13 up to the upper edge 133 of the latter in the shape of letter L in section as at an open end 761, thereby assuring a tight adhesion of the layer to the hole.

On the other hand, in FIG. 8, the upper edge 762 of the metal plating layer 76 lies near the upper edge 133 of the mounting opening but does not terminate in the shape of L as shown FIG. 7. That is, the upper edge 762 of the metal plating layer 76 is below the upper surface of the substrate 10. As a result when an electronic component 38 is mounted in the mounting opening 13 and connected to the pattern 94 through a bonding wire 381, the bonding wire 381 is not brought into contact with the metal plating layer 76 thereby avoiding electrical short-circuiting.

Moreover, the above two type of boards have the same effect as that of the first embodiment.

5. Fifth Embodiment

Figure 9:
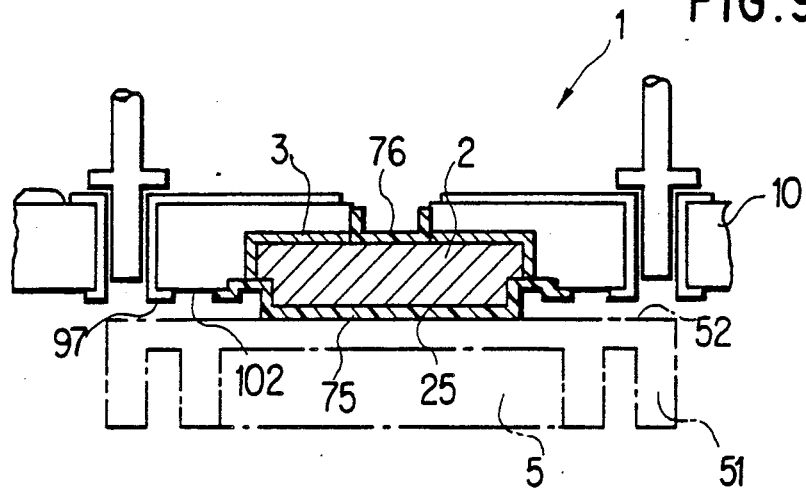
FIGS. 9 through 11 are sectional views, respectively, of an electronic component mounting board according to a fifth embodiment of the present invention.
Figure 10:
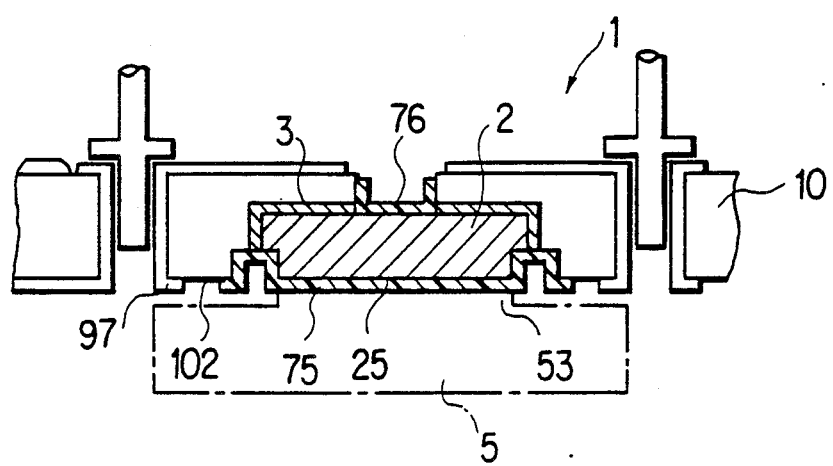
Figure 11:
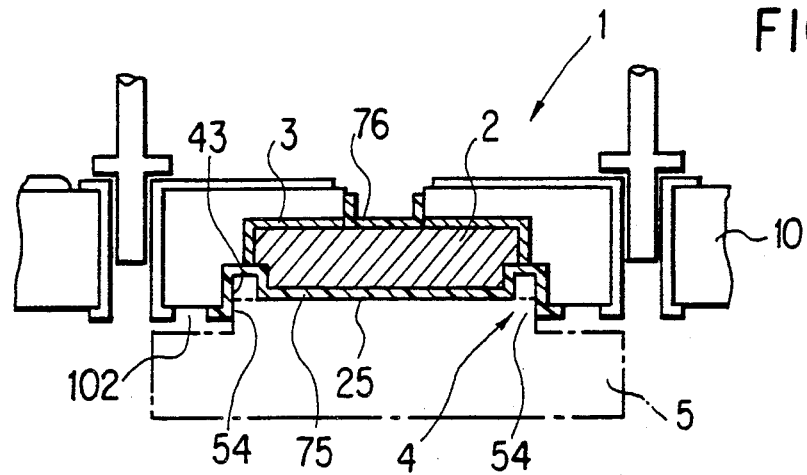

As shown in FIGS. 9 through 11, this embodiment represents a case in which the positional relationship between the lower surface 25 of the heat radiating plate and the rear surface 102 of the substrate is changed in consideration of attachment of a heat radiating fin 5 to the heat radiating plate 2.

That is, in the case of the board 1 shown in FIG. 9, the lower surface 25 of the heat radiating plate 2 projects downward from the level of the rear surface 102 of the substrate. Accordingly, when the heat radiating fin 5 is attached to the lower surface 25 of heat radiating plate 2 through the metal plating layer 75, a sufficient space is provided between the upper surface 52 of the heat radiating fin 5 and the lower surface of a land 97, thereby preventing electrical short-circuiting of the conductive circuit with respect to the heat radiating fin 5 and the land 97.

Further, in the case of the board 1 shown in FIG. 10, the lower surface 25 of the heat radiating plate is substantially in the same level as the rear surface 102 of the substrate and the heat radiating fin 5 is attached to the heat radiating plate 2 through the metal plating layer 75. In this case, the fin 5 has a projecting leg 53 having a surface substantially the same size as the lower surface 25 of the heat radiating plate so as to connect to the radiating plate 2. Thus, by so doing, the overall thickness of the electronic component mounting board with the heat radiating fin can be reduced.

In addition, the heat radiating plate 2 of the board 1 shown in FIG. 11 is arranged such that the lower surface 25 thereof is inside the rear surface 102 of the substrates 10. The heat radiating fin 5 is attached to the surface 25 through the metal plating layer 75. In this case, the leg 54 of the fin 5 is of a size sufficient to allow the leg to fit in the side wall 43 of the depression 4. Thus, according to this structure, the fixing position of the fin 5 can be determined by fitting the leg 54 into the depression 4, thereby facilitating the attachment of the fin 5.

All of the electronic component mounting boards shown in FIGS. 9 through 11 have the same effect as the first embodiment.

6. Sixth Embodiment

Figure 12:
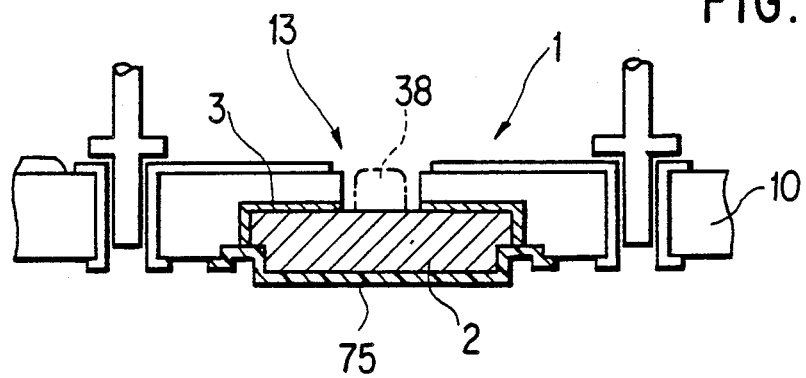
FIG. 12 and 13 are sectional views, respectively, of an electronic component mounting board according to a sixth embodiment of the present invention.
Figure 13:
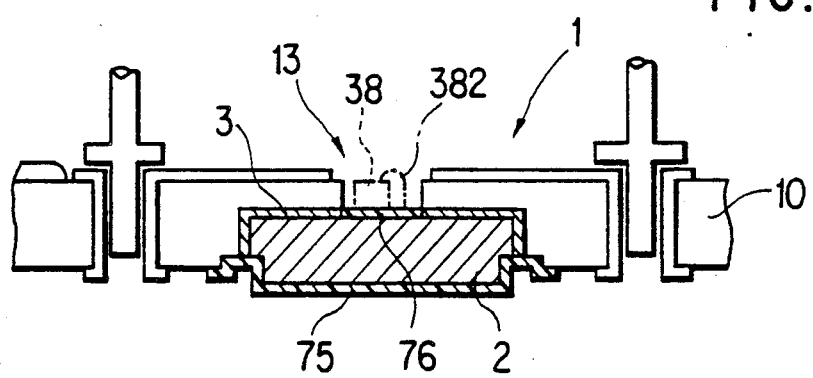

As shown in FIGS. 12 and 13, this embodiment represents cases in which the metal plating layer is present and absent in the mounting opening 13.

That is, the board 1 shown in FIG. 12 has the electronic component 38 directly bonded to the heat radiating plate 2 without providing any metal plating layer within the mounting hole 13. In this case, if copper is used as the material for the heat radiating plate 2 and a silver epoxy adhesive agent is used as the bond, the bonding strength of the two will be further enhanced by the copper oxide generated over the heat radiating plate 2 and the connection between the heat radiating plate 2 and the electronic component 38 will be further strengthened.

The board 1 shown in FIG. 13 has a Ni-Au metal plating layer 76 formed only on the bottom surface of the mounting opening 13 and a bonding wire 382 is connected between the electronic component 38 and the metal plating layer 76. In this case, the heat radiating plate 2 serves as an earthing plate.

The above board 1 may be manufactured by the steps of forming a copper pattern on the surface of the substrate 10, forming the electronic part mounting opening 13 using an end mill in the substrate, forming the Ni-Ai metal plating layer 76 only on the bottom surface of the opening 13 and then connecting the bonding wire 382.

Therefore, unlike the method (first embodiment) in which the pattern is formed after forming the mounting opening 13 in the substrate 10, it is not necessary to provide a mask within the hole 13 at the time of forming the pattern.

Each of the above boards has the same effect as that of the first embodiment.

7. Seventh Embodiment

Figure 14:
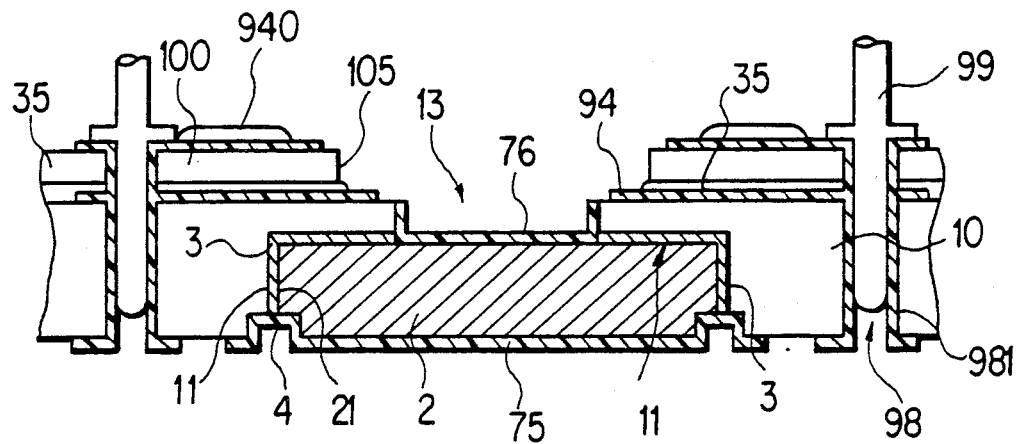
FIG. 14 is sectional view of an electronic component mounting board according to a seventh embodiment of the present invention.

As shown in FIG. 14 this embodiment represents a multi-layer electronic component mounting board in which an upper substrate 100 having a pattern 940 formed thereon is further provided on the pattern 94 formed on the upper surface of the substrate 10 as a conductive circuit, with respect to the first embodiment.

The upper substrate 100 is bonded to the pattern 94 by means of a bonding agent 35, and has an open end 105 open to the electronic component mounting opening 13.

The aforesaid multi-layer electronic component mounting board may be manufactured by a cap opening method (Japanese Patent Application Laid Open No. 156847/1987). The upper substrate 100 may be composed of one to five layers.

According to this embodiment, a multi-layer pattern can be formed, so it is possible to manufacture an electronic part mounting board having more conductive circuits.

This type of board has the same effect as that of the first embodiment.

8. Eighth Embodiment

Figure 15:
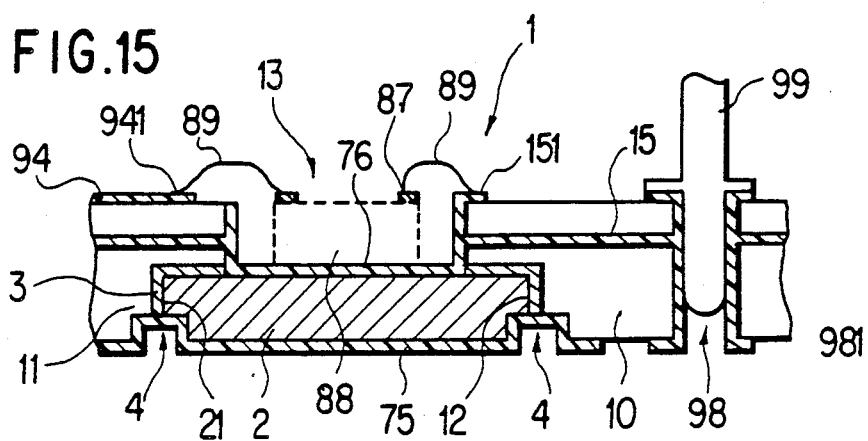
FIG. 15 is a sectional view of an electronic component mounting board according to an eighth embodiment of the present invention.

As shown in FIG. 15, this embodiment represents a case in which the substrate 10 has an inside power supply circuit 15, one end of the circuit is electrically connected to a through hole 98, and the other end is connected to the metal plating layer 76 provided on the surface of the electronic part mounting opening 13. The upper part of the metal plating layer 76 is partly extended to the upper edge of the mounting opening, thereby forming a power supply terminal 151.

The inside power supply circuit 15 provided inside the substrate has a width 10 to 100 times as large as the ordinary pattern 94. In FIG. 15, reference numerals 88, 87 and 89 designate an electronic part, a connecting terminal and a bonding wire, respectively.

According to this embodiment, as the power supply circuit is provided inside the substrate 10, it may have an optional size. The inductance of the power supply circuit may be reduced. As a result, it is possible to mount an electronic part having a high frequency range, i.e. tens to hundreds MHz on the electronic part mounting board according to the present invention.

This type of board has the same effect as that of the first embodiment.

In this embodiment, the inside power supply circuit may be employed as an inside earth circuit. Also in this case, the same effect may be obtained.

9. Ninth Embodiment

Figure 16:
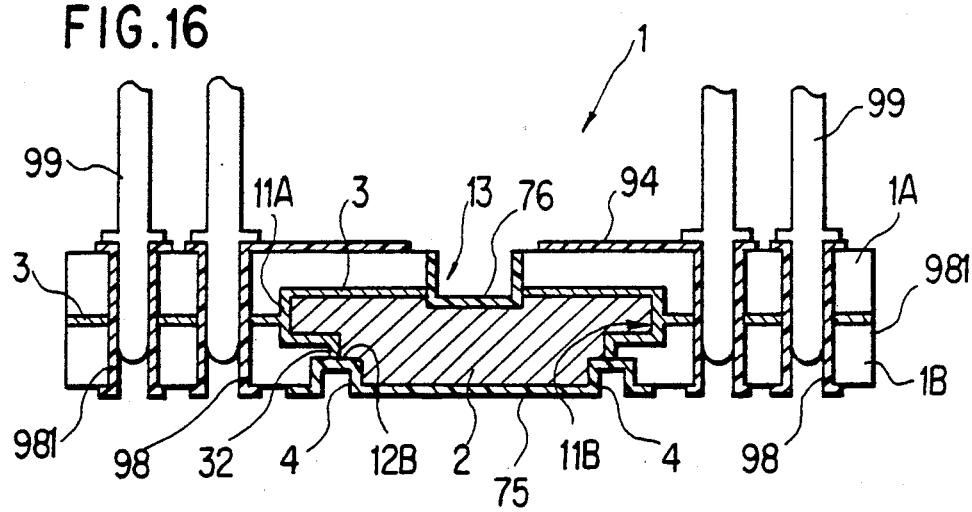
FIG. 16 is a sectional view of an electronic component mounting board according to a ninth embodiment of the present invention.

As shown in FIG. 16, this embodiment represents a case in which the heat radiating plate 2 is provided between two substrates. The heat radiating plate 2 is fixed with held between a first substrate 1A a second substrate 1B. The lower surface of the heat radiating plate 2 is exposed downward from a stepped hole 11B of the second substrate 1B. The first substrate 1A has a mounting opening 13 which reaches the heat radiating plate 2. The first and second substrates 1A and 1B, and the heat radiating plate 2 are attached to each other by means of a bonding agent.

The aforesaid electronic component mounting board is manufactured by the following processes.

The second substrate 1B is provided with a stepped hole 11B on the rear surface thereof so as to expose the lower surface of the heat radiating plate 2, while the first substrate 1A is provided with an inner recess 11A on the rear surface thereof so as to insert an upper portion of the heat radiating plate 2. The heat radiating plate 2 is disposed between the stepped hole 11B of the second substrate 1B and the inner recess 11A of the first substrate 1A. Then, the first substrate 1A, the second substrate 1B and the heat radiating plate 2 are bonded to each other using the bonding material 3 in such a manner that the bonding material 3 is filled almost up to an open side of a clearance between a side wall of the stepped hole 11B and a side wall of the heat radiating plate 2. After that, the second substrate 1B and the heat radiating plate 2 is countersunk at a portion adjacent the open side of the clearance to provide an exposed depression 4 having a part of the bonding material exposed therein. An electronic part mounting opening 13 through the first substrate 1A and the bonding material 3 is formed so as to reach at least an upper surface of the heat radiating plate 2 from an upper surface of the first substrate 1A. Then, the lower surface of the heat radiating plate 2, the inner surface of the exposed depression 4 and the rear surface of the second substrate 1B is continuously covered with a metal plating layer. A circuit is formed on the surface of the substrates manufactured through the foregoing steps.

According to this embodiment, the heat radiating plate 2 is held between the first and second substrates 1A and 1B, so the heat radiating plate 2 cannot be come off. This type of board has the same effect as that of the first embodiment.

10. Tenth Embodiment

Figure 17:
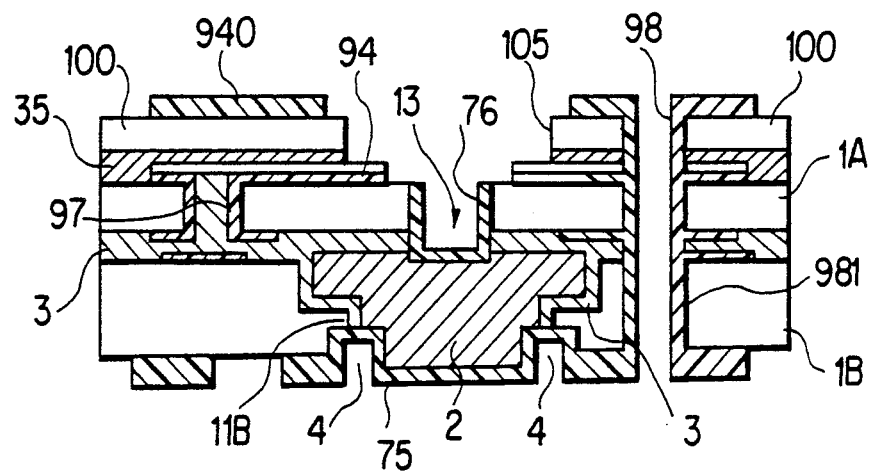
FIG. 17 is a sectional view of an electronic component mounting board according to a tenth embodiment of the present invention.

As shown in FIG. 17, this embodiment represents a case in which the electronic part mounting board of the ninth embodiment is formed as a multi-layer structure. In the electronic component mounting board of this embodiment, a pattern 940 is further formed on the conductive circuit pattern 94 of the ninth embodiment, via an upper substrate 100. In addition, it also comprises an inner via hole 97.

According to this embodiment, the same effect as in the first, seventh and ninth embodiments can be obtained.

11. Eleventh Embodiment

Figure 18:
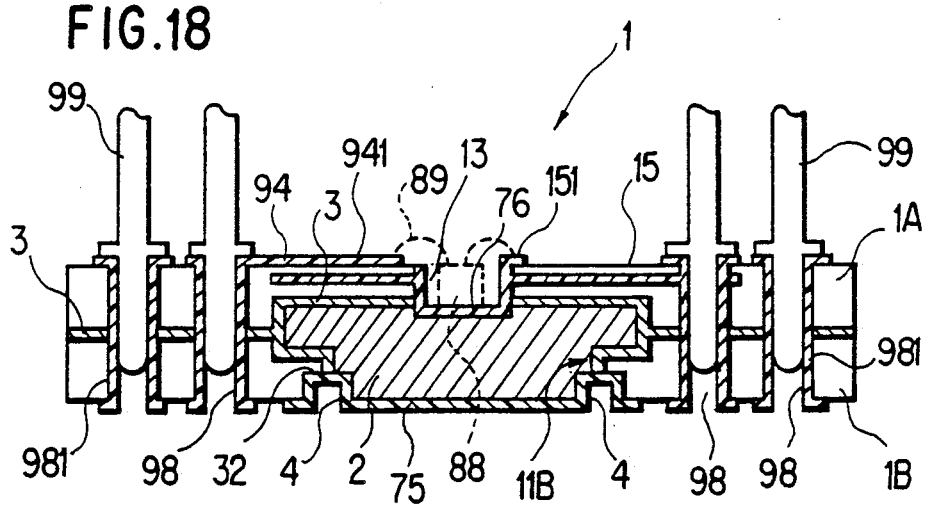
FIG. 18 is a sectional view of an electronic component mounting board according to an eleventh embodiment of the present invention.
Figure 19A:
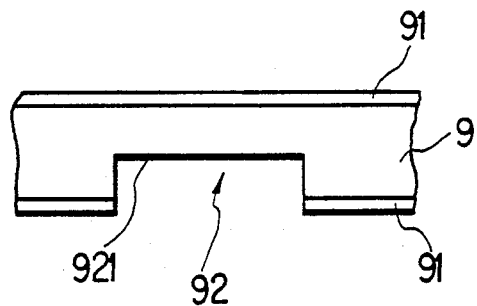
Figure 19B:
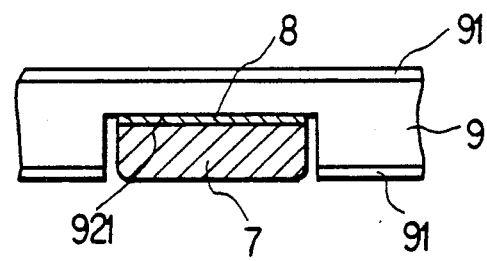
Figure 19C:
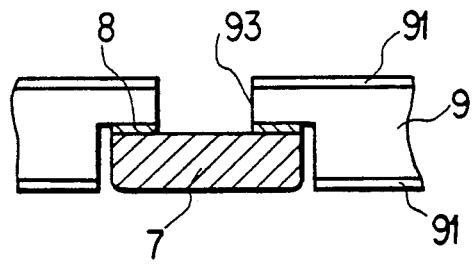
Figure 19D:
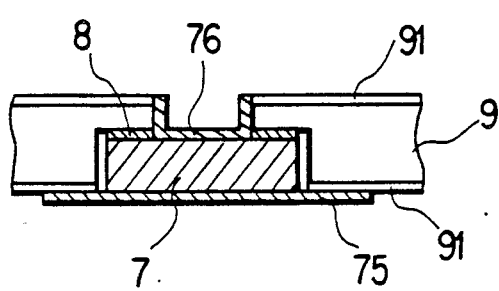
Figure 19E:
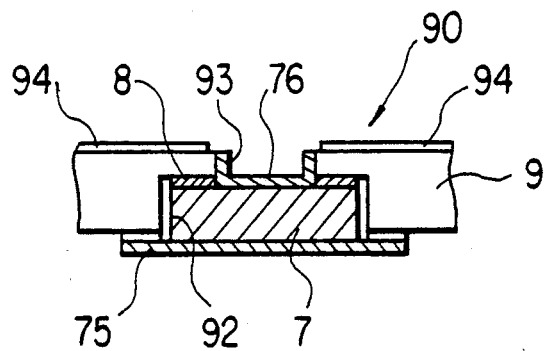

As shown in FIG. 18, this embodiment represents a case in which an inside power supply circuit 15 is provided inside the first substrate 1A in the electronic part mounting board of the ninth embodiment.

In the inside power supply circuit 15, one end is electrically connected to the through hole 98, and the other end is connected to the metal plating layer 76 of the mounting opening 13. The upper part of the metal plating layer 76 is partly extended to the upper edge of the mounting opening, thereby forming a power supply terminal 151.

The inside power supply circuit 15 has a width 10 to 100 times as large as the ordinary pattern 94. The inside power supply circuit may be employed as an inside earth circuit.

According to this embodiment, the inductance of the power supply circuit may be reduced in the same manner as in the eighth embodiment. The same effect as in the first embodiment can be obtained.

What is claimed is:

1. An electronic component mounting board comprising:
  a substrate having an electronic component mounting opening formed in an upper surface thereof and a recess provided on a rear surface thereof larger in size than said electronic component mounting opening;
  a heat radiating plate fixed to said recess by means of a bonding material along an upper surface of said heat radiating plate exposed to said electronic component mounting opening wherein a clearance of from 0.05 mm to 0.3 mm is formed between said substrate and said heat radiating plate and said bonding material is located with said clearance;
  an exposed depression extending over said substrate and said heat radiating plate at a position where a side wall of said recess and a side wall of said heat radiating plate confront each other and having a part of said bonding material exposed so as to be flush with a surface thereof; and
  a metal plating layer continuously covering in sequence at least part of a lower surface of said heat radiating plate, a surface of said exposed depression and at least part of a rear surface of said substrate.

2. An electronic component mounting board according to claim 1, wherein said bonding material located in said clearance is exposed to said exposed depression, and an exposed surface of said bonding material is flush with a reversed bottom surface of said exposed depression.

3. An electronic component mounting board according to claim 1, wherein a sectional shape of said exposed depression has one of a square, semicircular, triangular and elliptical shape.

4. An electronic component mounting board according to claim 1, wherein an inside surface of said electronic component mounting opening is covered with a metal plating layer.

5. An electronic component mounting board according to claim 4, wherein said metal coating layer is provided extending up to an upper edge of said electronic component mounting opening to form an opening of L-shape in section.

6. An electronic component mounting board according to claim 4, wherein said metal coating layer is provided extending near an upper edge of said electronic component mounting opening.

7. An electronic component mounting board according to claim 1, wherein said heat radiating plate has a heat radiating fin connected thereto.

8. An electronic component mounting board according to claim 7, wherein said heat radiating fin has a projecting leg having a width which is the same as said heat radiating plate and is connected thereto.

9. An electronic component mounting board according to claim 1, wherein said electronic component is directly bonded to said heat radiating plate by means of said bonding material.

10. An electronic component mounting board comprising:
- a substrate having an electronic component mounting opening formed in an upper surface thereof and a recess provided on a rear surface thereof larger in size than said electronic component mounting opening;
- a heat radiating plate fixed to said recess by means of a bonding material along an upper surface of said heat radiating plate exposed to said electronic component mounting opening;
- an exposed depression extending over said substrate and said heat radiating plate at a position where a side wall of said recess and a side wall of said heat radiating plate confront each other and having a part of said bonding material exposed so as to be flush with a surface thereof; and
- a metal plating layer continuously covering in sequence at least part of a lower surface of said heat radiating plate, a surface of said exposed depression and at least part of a rear surface of said substrate, wherein said exposed depression has a depth of 0.05 mm to 0.2 mm.

11. An electronic component mounting board comprising:
- a substrate having an electronic component mounting opening formed in an upper surface thereof and a recess provided on a rear surface thereof larger in size than said electronic component mounting opening;
- a heat radiating plate fixed to said recess by means of a bonding material along an upper surface of said heat radiating plate exposed to said electronic component mounting opening;
- an exposed depression extending over said substrate and said heat radiating plate at a position where a side wall of said recess and a side wall of said heat radiating plate confront each other and having a part of said bonding material exposed so as to be flush with a surface thereof; and
- a metal plating layer continuously covering in sequence at least part of a lower surface of said heat radiating plate, a surface of said exposed depression and at least part of a rear surface of said substrate, wherein said exposed depression has a width of 0.5 mm to 2.0 mm.

12. An electronic component mounting board comprising:
- a substrate having an electronic component mounting opening formed in an upper surface thereof and a recess provided on a rear surface thereof larger in size than said electronic component mounting opening;
- a heat radiating plate fixed to said recess by means of a bonding material along an upper surface of said heat radiating plate exposed to said electronic component mounting opening;
- an exposed depression extending over said substrate and said heat radiating plate at a position where a side wall of said recess and a side wall of said heat radiating plate confront each other and having a part of said bonding material exposed so as to be flush with a surface thereof; and
- a metal plating layer continuously covering in sequence at least part of a lower surface of said heat radiating plate, a surface of said exposed depression and at least part of a rear surface of said substrate, wherein said heat radiating plate has a heat radiating fin connected thereto and wherein said heat radiating plate is arranged such that a lower surface thereof is positioned within a rear surface of said substrate so as to form a depression.

13. An electronic component mounting board according to claim 9, wherein said bonding material comprises a silver epoxy adhesive agent.

14. An electronic component mounting board according to claim 1, wherein said metal plating layer is formed only on a bottom surface of said electronic component mounting opening so as to provide an electronic component thereon, and a bonding wire is connected between said electronic component and said metal plating layer on said bottom surface.

15. An electronic component mounting board according to claim 1, wherein an upper substrate having a pattern as a conductive circuit formed thereon is provided on an upper surface of said substrate so as to provide a multi-layer electronic component mounting board.

16. An electronic component mounting board according to claim 1, wherein said substrate has an power supply circuit positioned therein, and one end of said power supply circuit is electrically connected to a through hole and the other end is connected to a metal plating layer formed on said electronic component mounting opening.

17. An electronic component mounting board according to claim 1, wherein said substrate has an earth circuit positioned therein, and one end of said earth circuit is electrically connected to a through hole and the other end is connected to a metal plating layer formed on said electronic component mounting opening.

18. An electronic component mounting board comprising:
- a substrate having an electronic component mounting opening formed in an upper surface thereof and a recess provided on a rear surface thereof larger in size than said electronic component mounting opening;
- a heat radiating plate fixed to said recess by means of a bonding material along an upper surface of said heat radiating plate exposed to said electronic component mounting opening;
- an exposed depression extending over said substrate and said heat radiating plate at a position where a side wall of said recess and a side wall of said heat radiating plate confront each other and having a part of said bonding material exposed so as to be flush with a surface thereof; and
- a metal plating layer continuously covering in sequence at least part of a lower surface of said heat radiating plate, a surface of said exposed depression and at least part of a rear surface of said substrate, wherein said substrate comprises a first substrate and a second substrate so as to hold said heat radiating plate therebetween, and a lower surface of said heat radiating plate is exposed to atmosphere.

19. An electronic component mounting board according to claim 18, wherein an upper substrate having a pattern as a conductive circuit formed thereon is provided on an upper surface of said first substrate so as to provide a multi-layer electronic component mounting board.

20. An electronic component mounting board according to claim 18, wherein said first substrate has an inside power supply circuit therein, and one end of said inside power supply circuit is electrically connected to a through hole and the other end is connected to the metal plating layer formed on said electronic component mounting opening.

21. An electronic component mounting board according to claim 19, wherein said first substrate has a circuit positioned therein, and one end of said circuit is electrically connected to a through hole and the other end is connected to the metal plating layer formed on said electronic component mounting opening.

22. A method of manufacturing an electronic component mounting board which comprises:
   forming a recess in a rear surface of a substrate;
   bonding a heat radiating plate to said recess using a bonding material in such a manner that said bonding material is filled almost up to an open side of a clearance of from 0.05 mm to 0.3 mm between a side wall of said recess and a side wall of said heat radiating plate;
   countersinking said substrate and said heat radiating plate at a portion adjacent an open side of said clearance to provide an exposed depression of a depth of 0.05 mm to 0.2 mm and a width of 0.05 mm to 0.2 mm and exposing a part of said bonding material therein;
   forming an electronic part mounting opening through said substrate and said bonding material from an upper surface of said substrate to reach at least an upper surface of said heat radiating plate;
   covering continuously at least part of a lower surface of said heat radiating plate, an inner surface of said exposed depression and at least part of a rear surface of said substrate with a metal plating layer; and
   forming a circuit on the surface of said substrate manufactured through said foregoing steps.

23. A method of manufacturing an electronic component mounting board according to claim 22, wherein said bonding material is supplied to said clearance in such a manner that said bonding material overflow the open side of said clearance when said heat radiating plate is bonded to said recess.

24. A method of manufacturing an electronic component mounting board comprising the steps of:
   forming a stepped hole on a rear surface of a second substrate so as to expose a lower surface of a heat radiating plate, while forming an inner recess on a rear surface of a first substrate so as to insert an upper portion of said heat radiating plate;
   disposing said heat radiating plate between said stepped hole of said second substrate and said inner recess of said first substrate;
   bonding said first substrate, said second substrate and said heat radiating plate with each other with a bonding material in such a manner that said bonding material is filled almost up to an open side of a clearance of from 0.05 mm to 0.2 mm between a side wall of said stepped hole and a side wall of said heat radiating plate;
   countersinking said second substrate and said heat radiating plate at a portion adjacent an open side of said clearance to provide an exposed depression of a depth of 0.05 mm to 0.2 mm and a width of from 0.05 mm to 0.2 mm and exposing a part of said bonding material therein;
   forming an electronic part mounting opening through said substrate and said bonding material from an upper surface of said substrate to reach at least an upper surface of said heat radiating plate;
   covering continuously at least part of a lower surface of said heat radiating plate, an inner surface of said exposed depression and at least part of a rear surface of said second substrate with a metal plating layer; and
   forming a circuit on the surface of said first and second substrates manufactured through said foregoing steps.

* * * * *